(12) United States Patent
Rupp et al.

(10) Patent No.: US 9,735,356 B2
(45) Date of Patent: Aug. 15, 2017

(54) STRAINED MULTILAYER RESISTIVE-SWITCHING MEMORY ELEMENTS

(71) Applicant: ETH Zurich, Zurich (CH)

(72) Inventors: Jennifer L. M. Rupp, Zurich (CH); Sebastian Schweiger, Zurich (CH); Felix Messerschmitt, Zurich (CH)

(73) Assignee: ETH Zurich, Zurich (CH)

( * ) Notice: Subject to any disclaimer, the term of this patent is extended or adjusted under 35 U.S.C. 154(b) by 124 days.

(21) Appl. No.: 14/784,775

(22) PCT Filed: Apr. 16, 2014

(86) PCT No.: PCT/EP2014/001020
§ 371 (c)(1),
(2) Date: Oct. 15, 2015

(87) PCT Pub. No.: WO2014/170023
PCT Pub. Date: Oct. 23, 2014

(65) Prior Publication Data
US 2016/0087196 A1    Mar. 24, 2016

(30) Foreign Application Priority Data
Apr. 19, 2013  (EP) .................... 13002075

(51) Int. Cl.
*H01L 47/00*  (2006.01)
*H01L 45/00*  (2006.01)
*H01L 27/24*  (2006.01)

(52) U.S. Cl.
CPC ...... *H01L 45/1233* (2013.01); *H01L 27/2463* (2013.01); *H01L 27/2481* (2013.01); *H01L 45/04* (2013.01); *H01L 45/1253* (2013.01); *H01L 45/146* (2013.01); *H01L 45/147* (2013.01); *H01L 45/1608* (2013.01); *H01L 45/1616* (2013.01)

(58) Field of Classification Search
CPC ........................... H01L 45/1253; H01L 45/10
See application file for complete search history.

(56) References Cited

U.S. PATENT DOCUMENTS

| | | |
|---|---|---|
| 8,049,305 B1 | 11/2011 | Miller et al. |
| 2004/0159868 A1* | 8/2004 | Rinerson ............. G11C 11/5685 257/295 |
| 2005/0245039 A1 | 11/2005 | Li et al. |
| 2011/0227020 A1 | 9/2011 | Sekar et al. |
| 2013/0071984 A1 | 3/2013 | Wang et al. |

* cited by examiner

*Primary Examiner* — Samuel Gebremariam
(74) *Attorney, Agent, or Firm* — The Webb Law Firm

(57) ABSTRACT

The resistive-switching memory element of the present invention comprises a first electrode, a resistive-switching element; and a second electrode wherein the resistive-switching element is arranged between the first electrode and the second electrode and the resistive-switching element comprises, or consists of, a plurality of metal oxide layers and wherein neighboring metal oxide layers of the resistive-switching element comprise, or consist of, different metal oxides.

22 Claims, 3 Drawing Sheets

STRAINED MULTILAYER RESISTIVE-SWITCHING MEMORY ELEMENTS

CROSS-REFERENCE TO RELATED APPLICATIONS

This application is the United States national phase of International Application No. PCT/EP2014/001020 filed Apr. 16, 2014, and claims priority to European Patent Application No. 13002075.3 filed Apr. 19, 2013, the disclosures of which are hereby incorporated in their entirety by reference.

TECHNICAL FIELD

The present invention relates to resistive-switching memory elements for use in data storage devices.

PRIOR ART

Resistive random-access memory (ReRAM) is a non-volatile memory type that may be used as memory for different computing devices, such as computers, game consoles, portable phones, or in portable data storage devices.

Today's computing devices and portable data storage devices use different types of volatile and non-volatile memory, such as Dynamic random-access memory (DRAM) and variations thereof, where each bit making up the digital information is stored in a separate capacitor within an integrated circuit. The capacitor can be either charged or discharged; these two states are taken to represent the two values of a bit. However, an important drawback of DRAM is that since capacitors leak charge, the information eventually fades unless the capacitor charge is refreshed periodically. Thus, DRAM is considered to be a highly volatile memory. Because of this refresh requirement, such memory types consume substantial amounts of energy in the computing devices that incorporate them, and it is highly desirable, in particular in view of the increase in portable computing devices, to commercially provide memory types that do not need such refreshing of the memory elements because of their toll on battery life.

On the other hand, there exist types non-volatile memory, such as NAND or NOR flash memory which are mainly incorporated in portable data storage devices. While such types of memory do not a require periodical refresh, the individual memory elements require high voltage pulses for setting and reading a bit value, which again is unfavourable in computing devices that rely on a battery as a source of electrical energy. Moreover, the speed at which such memory elements can be accessed is unsatisfactory. Another issue with flash memory is that after a certain number of read/write cycles, the memory elements cease to function. In order to mitigate the drawbacks of such cycle-dependent wear, complex control programs are used that prolong service life of such memory elements by distributing the wear evenly among all memory elements of the flash memory. However, such measures do not alter the fact that such flash memory has significantly lower life spans than for example SDRAM.

U.S. Pat. No. 8,049,305 discloses a resistance-change memory device that uses stress-engineering, which device includes a first layer including a first conductive electrode, a second layer above the first layer including a resistive-switching element, and a third layer above the second layer including a second conductive electrode, where a first stress is created in the switching element at a first interface between the first layer and the second layer upon heating the memory element, and where a second stress is created in the switching element at a second interface between the second layer and the third layer upon the heating. The stress is caused upon heating by engineering a memory device where the materials of the resistive-switching element and the electrodes have different coefficients of thermal expansion (CTE).

However, the resistive-switching memory elements of U.S. Pat. No. 8,049,305 fails to provide commercial application-grade read properties, since the small difference between the high resistance state (RH) and the low resistance state (RL) of the resistive-switching element inhibits a fast and easy read access. Although to a lesser extent, the resistive-switching elements of U.S. Pat. No. 8,049,305 exhibit analogous problems to capacitor-based types of memory, since it has been found that the small difference in resistance states leads to a time-dependent fading of the stored information, as a previously set high resistance state (RH) eventually reverts back to the low resistance state (RL).

There is therefore a need to provide for less volatile, more energy efficient, more wear-resistant, and also faster types of memory elements that can be manufactured using pre-existing equipment, and at affordable cost.

SUMMARY OF THE INVENTION

Further embodiments of the invention are laid down in the dependent claims.

BRIEF DESCRIPTION OF THE DRAWINGS

Preferred embodiments of the invention are described in the following with reference to the drawings, which are for the purpose of illustrating the present preferred embodiments of the invention and not for the purpose of limiting the same. In the drawings.

DESCRIPTION OF PREFERRED EMBODIMENTS

Figure 1:
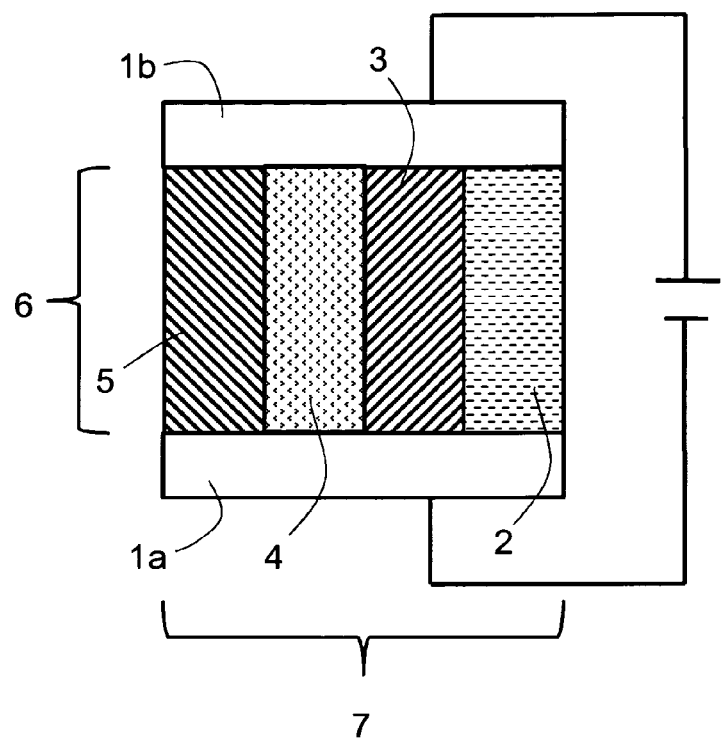
FIG. 1 shows a schematic drawing of a resistive-switching memory element 7 consisting of a first and second electrode 1a and 1b and a resistive-switching element 6 having 4 different metal oxide layers 2,3,4,5 oriented parallel to a plane defined by the first or second electrodes 1a and 1b
Figure 2:
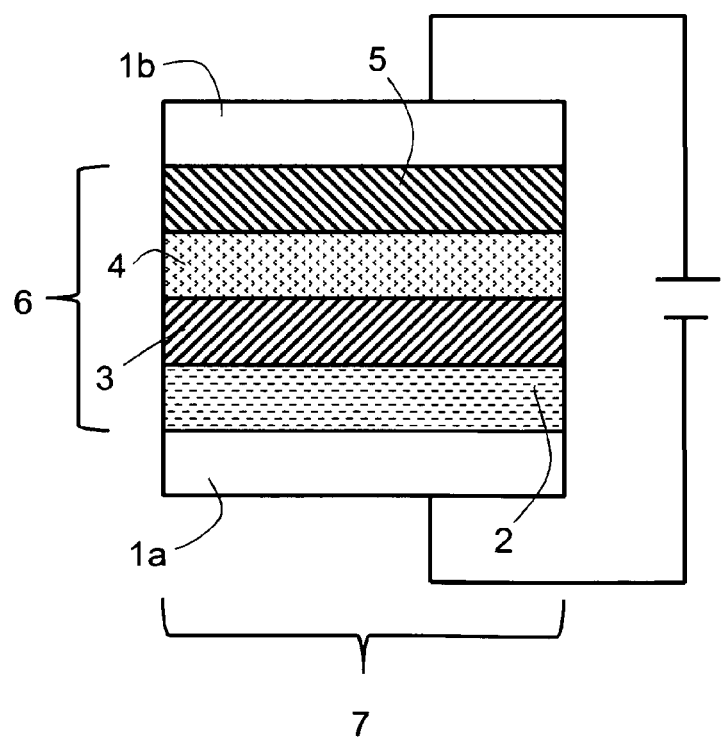
FIG. 2 shows a schematic drawing of a resistive-switching memory element 7 consisting of a first and second electrode 1a and 1b and a resistive-switching element 6 having 4 different metal oxide layers 2,3,4,5 oriented parallel to a plane defined by the first or second electrodes 1a and 1b
Figure 3:
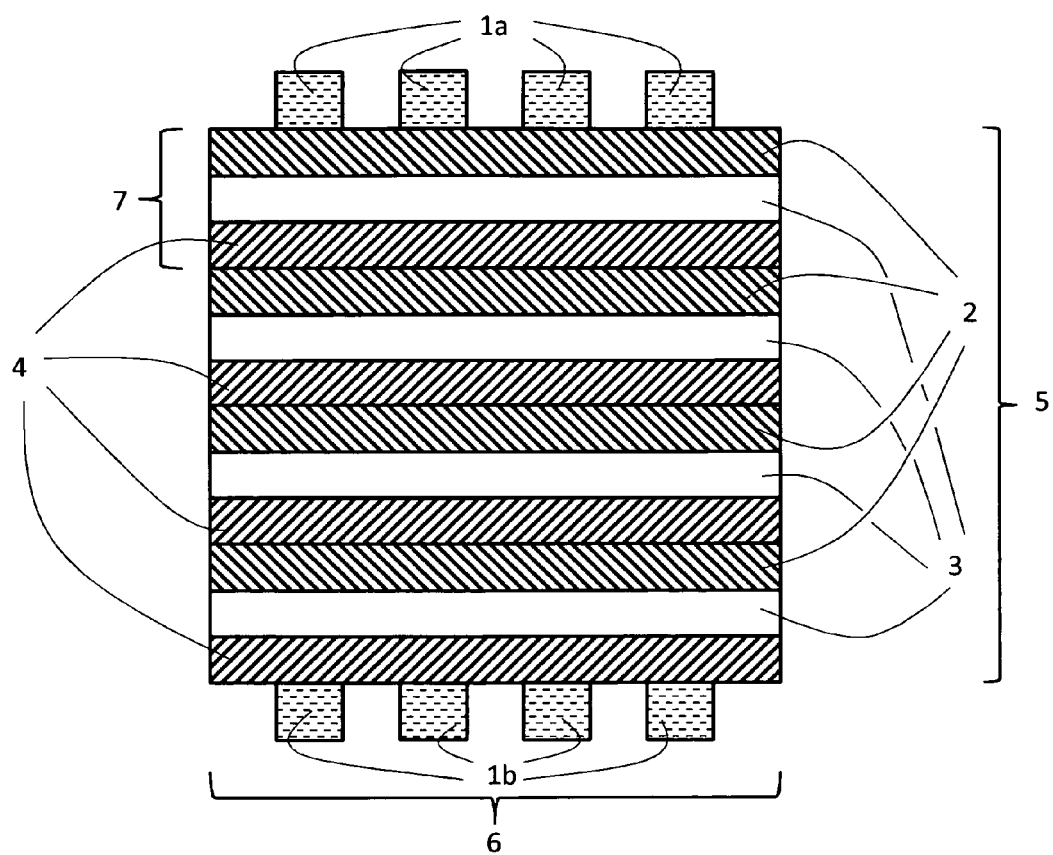
FIG. 3 shows a schematic drawing of a resistive-switching memory element 6 consisting of a first and second electrode 1a and 1b and a resistive-switching element 5 consisting of 4 periodic repeats of a metal oxide multilayer 7 consisting of 3 metal oxide layers 2,3,4.
Figure 4:
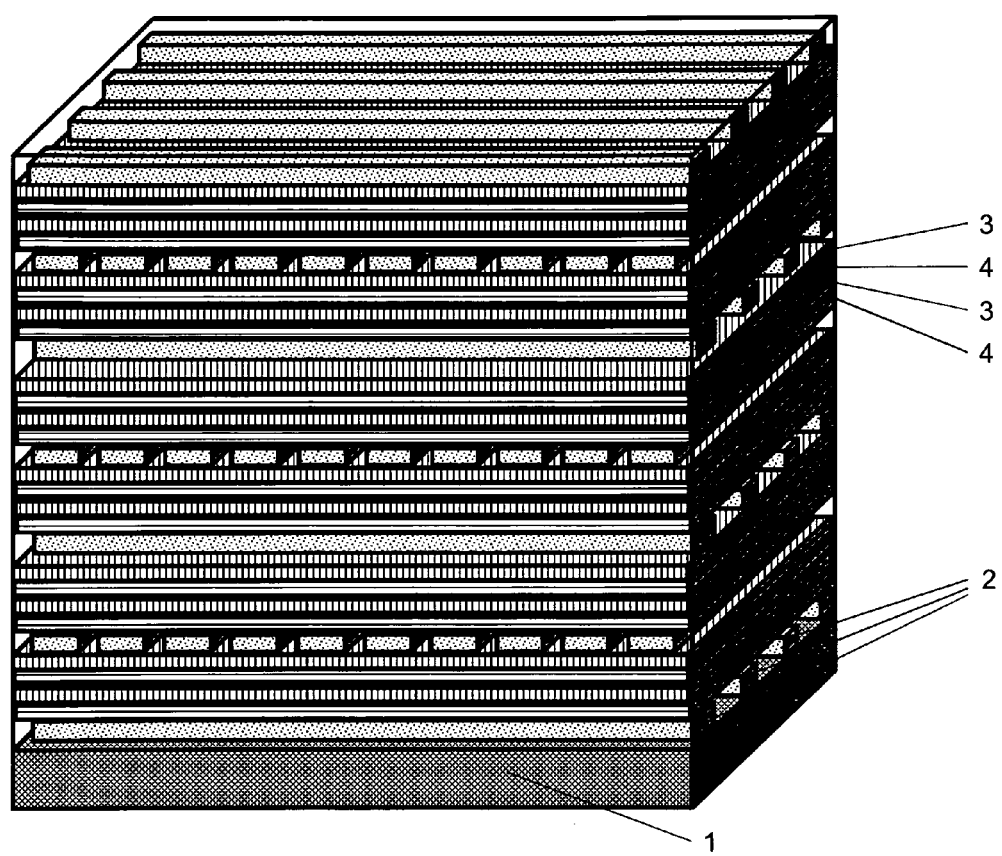
FIG. 4 shows a schematic drawing of a three-dimensional array of resistive-switching memory elements each comprising two electrodes 2 on a substrate 1, and each comprising the resistive-switching elements consisting of 2 periodic repeats of a metal oxide multilayer consisting of 2 metal oxide layers 3,4.

The resistive-switching memory element of the present invention comprises a first electrode, a resistive-switching element; and a second electrode wherein the resistive-switching element is arranged between the first electrode and the second electrode and the resistive-switching element comprises, or consists of, a plurality of metal oxide layers and wherein neighboring metal oxide layers of the resistive-switching element comprise, or consist of, different metal oxides.

In the context of the present invention, the term "plurality of metal oxide layers" refers to 2 or more metal oxide layers.

The resistive-switching memory element of the present invention may be incorporated for example in memory devices for use in portable data storage devices or computing devices. The first electrode and second electrode materials include electrically conductive materials such as metals, in particular noble metals, and derivatives thereof. Of notice are doped silicon, aluminium zinc oxide (AZO), indium tin oxide (ITO), titanium nitride, tantalum nitride, tungsten, doped silicon (e.g. n-type or p-type), ruthenium, ruthenium oxide, platinum, titanium, silver, copper, aluminum, tantalum, chrome, cobalt, iron, gold, tungsten, iridium, iridium oxide, and nickel. The materials for each individual electrode can be chosen independently, or may be same. For example, the first and second electrode may be of platinum, or the first electrode may be of gold and the second electrode of titanium.

The geometry of the first and second electrode is such that the contact area between the first electrode and the resistive-switching element, and the contact area between the second electrode and the resistive-switching element allows for the setting and reading of the resistance states of the resistive-switching element. Exemplary geometries are square, rectangular, circular, ellipsoid, polygonal such as triangular or hexagonal.

Typically, the electrodes may have a thickness of from 1 nm to about 500 nm, preferably of from 1 to 100 nm.

The resistive-switching memory element of the present invention may be manufactured by deposition onto any suitable substrate material including silicon, and in particular can be also deposited onto a non-silicon substrate material such as aluminium oxide and in particular corundum or sapphire. Another type of suitable substrate materials can be polymer-based substrate materials such polyimide films, in particular poly-oxydiphenylene-pyromellitimide films available commercially under the trademark KAPTON by E. I. du Pont de Nemours and Company of Delaware. In a particular embodiment of the present invention, the resistive-switching memory element of the present invention is deposited on a sheet of transparent, flexible substrate material such as a polymer-based substrate material and the first and second electrodes are made from a transparent material such as for example aluminium zinc oxide (AZO) or indium tin oxide (ITO) to yield a flexible, transparent memory device.

The resistive-switching element of the resistive-switching memory element of the present invention comprises a plurality of metal oxide layers. The metal oxide layers comprised in the plurality of metal oxide layers may be arranged essentially parallel to each other such as to form a stack of metal oxide layers.

In addition to being arranged essentially parallel to each other, the metal oxide layers within in the resistive-switching memory element of the present invention can be oriented essentially parallel to a plane defined by the first or second electrodes or can be oriented essentially normal to a plane defined by the first or second electrode.

The basic principle by which the present resistive-switching memory element is capable of storing information is that of known resistive-switching memory elements, in which the current—voltage characteristic of the resistive-switching element exhibits a non-linear hysteretic behavior, which may be defined by more than one resistance state. Thus, binary information may be stored by setting the resistance state of the resistive-switching element to a particular resistance state. A desired resistance state can be set by applying an electrical potential between the two electrodes across the resistive-switching element.

In the resistive-switching memory element of the present invention, the neighbouring metal oxide layers of the resistive-switching element comprise different metal oxides. Since different metal oxides in principle have different lattice constants, the resulting lattice mismatch at the interface between two neighboring metal oxide layers creates a strain s in the neighboring metal oxide layers of each. Without wishing to be bound to a particular theory, it is believed that this strain in turn induces defects such as vacancies and interstitials in the metal oxide layers, particularly in the vicinity of the interfaces, and these defects are believed to contribute to the conduction in the metal oxide layers.

In a preferred embodiment of the resistive-switching memory element according to the present invention, neighboring metal oxide layers comprised in the plurality of metal oxide layers may exhibit a lattice mismatch of more than 0.5%, preferably of from 1 to 10%, more preferably of from 1 to 4%.

The lattice mismatch between neighboring metal oxide layers can be determined by comparing the lattice constants of the metal oxides according to the following formula (I):

$$[(a-b)/a]*100,$$

where a corresponds to the lattice constant of the metal oxide layer having the larger lattice constant and b corresponds to the lattice mismatch of the metal oxide having the smaller lattice constant.

The neighboring metal oxide layers comprised in the plurality of metal oxide layers may exhibit a lattice mismatch of more than 0.5%, preferably of from 1 to 10%, more preferably of from 1 to 4% in at least one dimension, more preferably in at least two dimensions, and most preferably in all three dimensions. A lattice mismatch may also exist in the case where neighboring metal oxide layers have a lattice constant commensurability. The term "commensurability" refers to a relation between two materials in which the lattice constant of one material corresponds essentially to an integral multiple of the lattice constant of other material. For instance, in the case where both neighboring materials have a cubic crystal structure and where the first material has a lattice constant $a=1.04d$ and the second material has a lattice constant of $b=d/2$, the neighboring materials have a lattice commensurability of 2.

The lattice mismatch is then calculated according formula (I), but by replacing the lattice constant of the material having the lesser lattice constant by the lattice constant times the commensurabilty, i.e. 2;

$$[(a-2*b)/a]*100,$$

Since in the instant example, the two materials have a cubic crystal structure, the lattice mismatch need only be calculated in one dimension, and in this case the lattice mismatch is of 3.85% and 4 unit cells of the second material are deposited on top of each unit cell of the first material.

A person skilled in the art will recognize that a lattice mismatch can be determined also in the case where the crystals structures of the neighboring metal oxides are different. In the interest of brevity, not all the cases of lattice mismatch will be exemplified.

It has been found that lattice mismatches within the above-mentioned range are suitable for widening the difference in resistance states in a resistive-switching element and thereby also enhance resistance state retention, as well as to reduce read/write time when compared to existing DRAM types of memory.

In other words, it is necessary that the lattice mismatch between neighboring metal oxide layers is large enough to create a significant strain at the interface, which then propagates into the bulk of the metal oxide layers. On the other hand a too big lattice mismatch does not yield oriented growth of one layer onto the next layer. In order to generate a strain c at the interface between two neighbouring metal oxide layers, it is therefore necessary that the neighbouring metal oxide layers of the resistive-switching element comprise different metal oxides having different lattice constants.

It has been found that the strain at can be engineered by combining a plurality of metal oxide layers in the resistive-switching elements, and a preferred embodiment of the present invention is that the plurality of metal oxide layers comprises, or consists of, at least a total of 3 metal oxide layers, and more preferably comprises, or consists of at least a total of 4 metal oxide layers. In some embodiments, the plurality of metal oxide layers comprises, or consists of, of from 4 to 1000, or from 24 to 500 metal oxide layers. By increasing the number of metal oxide layers in the resistive-switching element, the number of interfaces at which a strain c is created is increased, which in turn leads to increase in defects.

The metal oxide layers of the resistive-switching element each have a thickness of at least 1 unit cell of metal oxide and of no more than 500 nm. Preferably the metal oxide layers each have a thickness of from 2 to 100 unit cells of metal oxide or of from 1 nm to 500 nm. More preferably, the thickness of the each metal oxide layer is of from 10 to 500 nm. The thickness of each metal oxide layer may be chosen independently from the thickness of other metal oxide layers, but preferably, the thickness of each layer is essentially the same. The resistive-switching element may have a thickness of 1 to 1500 nm, but preferably has a thickness of from 100 to 1500 nm, more preferably of from 100 nm to 500 nm.

In another preferred embodiment the resistive-switching element comprises a plurality of metal oxide layers comprising periodic repeats of a metal oxide multilayer structure, preferably of from 2 to 400 periodic repeats, more preferably of from 5 to 50, or alternatively from 25 to 50 or from 50 to 400.

For example, in the case where the plurality of metal oxide layers consists of 2 periodic repeats of a multilayer metal oxide structure consisting of 2 metal oxide layers, where a first metal oxide layer is A and a second metal oxide layer is B, 2 periodic repeats of this multilayer metal oxide structure correspond to "A-B-A-B".

In a case where the plurality of metal oxide layers consists of 3 periodic repeats of a multilayer metal oxide structure consisting of 3 metal oxide layers, where a first metal oxide layer is A, a second metal oxide layer is B and a third metal oxide layer is C, 3 periodic repeats of this multilayer metal oxide structure correspond to "A-B-C-A-B-C-A-B-C".

In an exemplary embodiment of the resistive-switching memory of the present invention, the plurality of oxide layers comprised in the resistive-switching element consists of 10 periodic repeats of a multilayer metal oxide structure consisting of a layer yttria-stabilized zirconia (YSZ) and a layer of yttria (Y), wherein the resistive-switching element is arranged between two platinum electrodes (E1, E2); [E1-(YSZ-Y)$_{10}$-E2].

In yet another exemplary embodiment of the resistive-switching memory of the present invention, the plurality of oxide layers comprised in the resistive-switching element consists of 20 periodic repeats of a multilayer metal oxide structure consisting of a first layer of Gd-doped ceria (GDC), a second layer of erbia (E) and a third layer of yttria-stabilized zirconia (YSZ), wherein the resistive-switching element is arranged between two gold electrodes (E1, E2); [E1-(GDC-E-YSZ)$_{20}$-E2]

The strain $\epsilon$ at the interface between neighboring metal oxide layers of the resistive-switching element can be thus be engineered by the choice of neighboring metal oxides, which may have the same or different crystal structures. In a preferred embodiment, the crystal structures of neighboring metal oxide layers may be the same, and in particular may be of cubic crystal structure.

Each metal oxide layer may be of monocrystalline or polycrystalline nature, or of overall epitaxial nature. In the case where a metal oxide layer is polycrystalline, the size of the crystallites may range from 2 to 500 nm or from 2 to 250 nm.

In yet another embodiment, the neighboring metal oxides layers of the resistive-switching element may comprise, and preferably consist of, a metal oxide having a band gap of from 0.3 to 8.8 eV.

The metal oxide layers of the resistive-switching element comprise metal oxides having a perovskite structure, such as for example $SrFeO_3$, $SrTiO_3$ or $LaMnO_3$, or comprise binary metal oxides such as yttria-stabilised zirconia (YSZ), ytrria-stabilised hafnia (YSH), titanium dioxide ($TiO_2$) ($La_x$, $Sr_{1-x}$)($Co_y$,$Fe_{1-y}$)$O_3$, ($La_x$,$Sr_{1-x}$($Mn_y$,$Fe_{1-y}$)O $Sc_2O_3$, NiO, $VO_2$, $V_2O_5$, $Nb_2O_5$, $WO_3$, $Ta_2O_5$, Gd-doped ceria (GDC) or comprise rare earth metal oxides such as yttria ($Y_2O_3$) or erbia ($Er_2O_3$).

The present invention further provides for a data storage device, comprising a two- or three-dimensional array of electrically interconnected resistive-switching memory elements. A two-dimensional array may consist of a larger resistive-switching element where multiple pairs of smaller electrodes are affixed to in pairs on opposite sides, and three-dimensional arrays generally consist of stacked two-dimensional arrays.

The present invention further provides for a method for manufacturing a resistive-switching memory element according to the above description, comprising the steps of: a. depositing a layer of electrically conductive material on a substrate material to form a first electrode, b. depositing on top of the first electrode a multilayer metal oxide structure comprising, or consisting of, 2 or more metal oxide layers, each metal oxide layer having a thickness of at least 1 unit cell of metal oxide and of less than 500 nm, to form a resistive-switching element, c. depositing a layer of electrically conductive material on top of the plurality of metal oxide layers to form a second electrode, wherein neighboring metal oxide layers of the resistive-switching element comprise different metal oxides. Preferably the multilayer metal oxide structure comprises, or consists of, 3 or more metal oxide layers.

The deposition of the electrodes and of the metal oxide layers may be carried out using known physical or chemical vapor deposition methods. In particular, the metal oxide layers may be deposited by atomic layer deposition, whereas the electrodes can be deposited by sputtering.

In a preferred embodiment, the method for manufacturing a resistive-switching memory element is further characterized in that the deposition of the multilayer metal oxide structure comprising 2 or more metal oxide layers is repeated of from 1 to 500 times to form a plurality of metal oxide layers comprising, preferably consisting of, of 2 to 501 periodic repeats of the metal oxide multilayer structure.

EXAMPLES

Example 1

A first structured platinum electrode was deposited by sputtering deposition on a single crystal sapphire substrate. Subsequently, a layer of yttria-stabilized zirconia (YSZ) of 8 mol % of yttria having a lattice constant of 0.5125 nm and a layer of pure yttria ($Y_2O_3$) having a lattice constant of 1.0604 nm were deposited on the platinum electrode by atomic layer deposition (ALD), and this deposition step was repeated another 9 times to yield a stack of 10 periodic repeats of the metal oxide bilayer. Finally, the second structured platinum electrode was deposited by sputtering deposition on top of the stack of 10 periodic repeats and defined by photolithography. The thus obtained resistive-switching element, where the neighboring oxide layers have a commensurability of 2, had an overall thickness of 300 nm and a lattice mismatch of approx. 3.3%. The conductivity of the obtained resistive-switching element was measured and found to be $2.24 \times 10^{-2}$ S/m at 560° C. In contrast, an unstrained monolayer of YSZ of the same thickness was reported to have a conductivity $1.85 \times 10^{-2}$ S/m. The reduced conductivity of the strained resistive-switching element will allow faster writing and reading of the resistive state of the element when compared to the unstrained element.

Example 2

A first structured gold electrode was deposited by evaporation deposition on a silicon substrate having an insulating silicon oxide surface. Subsequently, a layer of Gd-doped ceria (GDC) having a lattice constant of 0.5411 nm and having a thickness of 5 nm was deposited by atomic layer deposition (ALD) on the electrode. A layer of erbia ($Er_2O_3$) having a thickness of 5 nm and having a lattice constant of 1.0536 nm was deposited by atomic layer deposition (ALD) on top of the layer of Gd-doped ceria (GDC). A layer of yttria-stabilized zirconia (YSZ) of 8 mol % of yttria having a lattice constant of 0.5125 nm and having a thickness of 5 nm, was deposited by atomic layer deposition (ALD) on the layer of layer of erbia (Er2O3). This 3-stage metal-oxide deposition was repeated another 19 times to yield a stack of 20 periodic repeats of the metal oxide trilayer. Finally, a second structured Titanium electrode was deposited by sputtering deposition on top of the stack of 20 periodic repeats and further defined by photolithography. The thus obtained resistive-switching element had an overall thickness of 300 nm.

Example 3

A first structured Titanium nitride (TiN) electrode was deposited by sputtering deposition on a silicon substrate. Subsequently, a layer of magnesium oxide was deposited having a thickness of 20 nm by pulsed laser deposition (PLD) on top of the first electrode, and a layer of strontium titanate ($SrTiO_3$) having a thickness of 10 nm was deposited on top of the layer of magnesium oxide by pulsed laser deposition (PLD). This deposition step was repeated another 4 times to yield a stack of 5 periodic repeats of the metal oxide bilayer.

Finally, a second structured Tantalum electrode was deposited by sputtering deposition on top of the stack of 5 periodic repeats and further defined by photolithography. The thus obtained resistive-switching element had an overall thickness of 150 nm.

The invention claimed is:

1. A resistive-switching memory element comprising:
   a first electrode;
   a resistive-switching element;
   a second electrode;
   wherein the resistive-switching element is arranged between the first electrode and the second electrode,
   wherein the resistive-switching element comprises a plurality of metal oxide layers,
   wherein neighbouring metal oxide layers of the resistive-switching element comprise different metal oxides, and
   wherein the metal oxides comprised in the neighbouring metal oxide layers have a lattice mismatch of from 1 to 4%.

2. The resistive-switching memory element according to claim 1, wherein the resistive-switching element comprises a plurality of metal oxide layers comprising a total of at least 3 metal oxide layers.

3. The resistive-switching memory element according to claim 1 wherein said plurality of metal oxide layers comprises periodic repeats of a metal oxide multilayer structure.

4. The resistive-switching memory element according to claim 3, wherein said plurality of metal oxide layers comprises from 2 to 400 periodic repeats of a metal oxide multilayer structure.

5. The resistive-switching memory element according to claim 3, wherein said plurality of metal oxide layers comprises from 5 to 50 periodic repeats of a metal oxide multilayer structure.

6. The resistive-switching memory element according to claim 1, wherein the metal oxide layers are oriented parallel to a plane defined by the first or second electrode.

7. The resistive-switching memory element according to claim 1, wherein the metal oxide layers are oriented normal to a plane defined by the first or second electrode.

8. The resistive-switching memory element according to claim 1, wherein the metal oxides layers comprise metal oxides having a perovskite structure.

9. The resistive-switching memory element according to claim 8, wherein the metal oxide layers comprise metal oxides having a perovskite structure and are chosen from the group consisting of $SrFeO_3$, $SrTiO_3$ or $LaMnO_3(La_x,Sr_{1-x})(Co_y,Fe_{1-y})O_3$, $(La_x,Sr_{1-x})(Mn_y,Fe_{1-y})O$.

10. The resistive-switching memory element according to claim 1, wherein the metal oxides layers comprise binary metal oxides.

11. The resistive-switching memory element according to claim 10, wherein the metal oxide layers comprise binary metal oxides and are chosen from the group consisting of yttria-stabilized zirconia, ytrria-stabilized hafnia, titanium dioxide, Gd-doped ceria, and zirconia.

12. The resistive-switching memory element according to claim 1, wherein the metal oxides layers comprise rare earth metal oxides.

13. The resistive-switching memory element according to claim 12, wherein the metal oxide layers comprise rare earth metal oxides and are chosen from the group consisting of yttria, ceria and erbia.

14. The resistive-switching memory element according to claim 1, wherein the resistive-switching element has a thickness of 1 to 1500 nm.

15. The resistive-switching memory element according to claim 1, wherein the metal oxide layers of the resistive-switching element each have a thickness of at least one unit cell of the respective metal oxide and of no more than 500 nm.

16. The resistive-switching memory element according to claim 1, wherein the resistive-switching memory element is a layered structure comprising a first layer being formed by the first electrode, a second layer being formed by the resistive-switching element, and a third layer being formed by the second electrode.

17. The resistive-switching memory element according to claim 1, wherein the metal oxide layers of the resistive-switching element comprise a metal oxide having a band gap of from 0.3 to 8.8 eV.

18. A data storage device, comprising a two- or three-dimensional array of electrically interconnected resistive-switching memory elements according to claim 1.

19. The resistive-switching memory element according to claim 1, wherein the resistive-switching element comprises a plurality of metal oxide layers comprising a total of at least four metal oxide layers.

20. A method for manufacturing a resistive-switching memory element according to claim 1, comprising the steps of:

a. depositing a layer of electrically conductive material on a substrate material to form a first electrode;

b. depositing on top of the first electrode a multilayer metal oxide structure comprising 2 or more metal oxide layers, each metal oxide layer having a thickness of at least 1 unit cell of metal oxide and of no more than 500 nm, to form a resistive-switching element; and c. depositing a layer of electrically conductive material on top of the plurality of metal oxide layers to form a second electrode, wherein neighbouring metal oxide layers of the resistive-switching element comprise different metal oxides and wherein the metal oxides comprised in the neighbouring metal oxide layers have a lattice mismatch of from 1 to 4%.

21. The method for manufacturing a resistive-switching memory element according to claim 20, wherein the step b. is repeated from 1 to 500 times to form a plurality of metal oxide layers comprising from 2 to 501 periodic repeats of the metal oxide multilayer structure.

22. The method for manufacturing a resistive-switching memory element according to claim 20, wherein the multilayer metal oxide structure comprises three or more metal oxide layers.

* * * * *